US010290333B2

(12) United States Patent
Lee et al.

(10) Patent No.: US 10,290,333 B2
(45) Date of Patent: May 14, 2019

(54) SEMICONDUCTOR DEVICE

(71) Applicant: SK hynix Inc., Icheon-si, Gyeonggi-do (KR)

(72) Inventors: Seol Hee Lee, Icheon-si (KR); Chang Hyun Kim, Seoul (KR); Dae Yong Shim, Seoul (KR); Kang Seol Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 120 days.

(21) Appl. No.: 15/612,150

(22) Filed: Jun. 2, 2017

(65) Prior Publication Data

US 2018/0068698 A1 Mar. 8, 2018

(30) Foreign Application Priority Data

Sep. 6, 2016 (KR) .......................... 10-2016-0114578

(51) Int. Cl.
*G11C 29/00* (2006.01)
*G11C 7/22* (2006.01)
(Continued)

(52) U.S. Cl.
CPC ............ *G11C 7/222* (2013.01); *G06F 11/108* (2013.01); *G11C 7/06* (2013.01); *G11C 7/1006* (2013.01); *G11C 7/109* (2013.01); *G11C 7/1009* (2013.01); *G11C 7/1063* (2013.01); *G11C 7/1084* (2013.01); *G11C 7/1096* (2013.01); *G11C 7/12* (2013.01); *G11C 8/12* (2013.01); *G11C 2029/0411* (2013.01)

(58) Field of Classification Search
CPC ........ G06F 11/108; G06F 11/10; G11C 7/222; G11C 7/12; G11C 7/109; G11C 7/1084; G11C 2029/0411; G11C 7/06; G11C 8/12; G11C 7/1006; G11C 7/1009; G11C 7/1096; G11C 7/1063; G11C 7/22; G11C 7/10
USPC .............. 714/731, 744, 763, 764, 777, 785, 714/800–805
See application file for complete search history.

(56) References Cited

U.S. PATENT DOCUMENTS 6,389,041 B1 * 5/2002 Morita ...................... G06F 1/12
370/503
2006/0126421 A1 * 6/2006 Hwang ................ G11C 7/1012
365/230.06

(Continued)

FOREIGN PATENT DOCUMENTS

KR 1020070099765 A 10/2007
KR 1020140126225 A 10/2014

*Primary Examiner* — Albert Decady
*Assistant Examiner* — Osman M Alshack
(74) *Attorney, Agent, or Firm* — William Park & Associates Ltd.

(57) ABSTRACT

A semiconductor device includes an internal operation control circuit suitable for generating a set period signal which is enabled for a set period, in response to a write command and an internal operation control signal, and generating a column select signal, an output control signal and an input control signal in response to the set period signal; and an internal operation circuit suitable for performing an internal operation of converting parity data generated from input data and storing the converted parity data in a memory cell array, in response to the column select signal, the output control signal and the input control signal.

19 Claims, 9 Drawing Sheets

(51) Int. Cl.
    *G06F 11/10*     (2006.01)
    *G11C 7/06*     (2006.01)
    *G11C 7/10*     (2006.01)
    *G11C 7/12*     (2006.01)
    *G11C 8/12*     (2006.01)
    *G11C 29/04*     (2006.01)

(56) References Cited

U.S. PATENT DOCUMENTS

| | | | | |
|---|---|---|---|---|
| 2006/0133166 A1* | 6/2006 | Kikutake | ............ | G06F 11/1032 365/201 |
| 2009/0119567 A1* | 5/2009 | Kawabata | ............ | G06F 11/1032 714/763 |
| 2009/0168555 A1* | 7/2009 | Lee | ............ | G11C 7/08 365/189.09 |
| 2010/0302873 A1* | 12/2010 | Lee | ............ | G11C 7/1045 365/189.05 |
| 2011/0187429 A1* | 8/2011 | Byeon | ............ | H03L 7/00 327/162 |
| 2013/0080826 A1* | 3/2013 | Kondo | ............ | G11C 7/1006 714/6.2 |
| 2013/0155784 A1* | 6/2013 | Lim | ............ | G11C 7/08 365/189.05 |
| 2013/0176796 A1* | 7/2013 | Tanabe | ............ | G11C 7/00 365/189.011 |
| 2014/0317470 A1* | 10/2014 | Chung | ............ | G06F 11/1076 714/764 |
| 2015/0155026 A1* | 6/2015 | Kim | ............ | G11C 11/4091 365/191 |
| 2015/0378826 A1* | 12/2015 | Zhang | ............ | H03M 13/2942 714/766 |

* cited by examiner

SEMICONDUCTOR DEVICE

CROSS-REFERENCE TO RELATED APPLICATION

The present application claims priority under 35 U.S.C. § 119(a) to Korean Patent Application No. 10-2016-0114578 filed on Sep. 6, 2016 in the Korean Intellectual Property Office, which is incorporated herein by reference in its entirety.

BACKGROUND

1. Technical Field

Embodiments of the present disclosure relate to a semiconductor device which performs a write operation by using an error correction code.

2. Description of the Related Art

Recently, in order to increase the operating speed of a semiconductor device, DDR2 or DDR3 signaling is used, in which 4-bit or 8-bit data are inputted/outputted in each clock cycle. In the case where an input/output speed of data is increased, the probability of an error occurring during a data transmission process increases. Therefore, a separate device and a method for ensuring the reliability of data transmission are additionally needed.

There is disclosed a method of generating, at each time of transmitting data, error codes capable of checking an occurrence of an error and transmitting the error codes with the data, thereby ensuring the reliability of the data transmission. The error codes include an error detection code (EDC) capable of detecting whether an error occurred, and an error correction code (ECC) capable of correcting, by itself, an error when an error has occurred.

SUMMARY

Various embodiments are directed to a semiconductor device which performs a write operation by using an error correction code.

In an embodiment, a semiconductor device may include: an internal operation control circuit suitable for generating a set period signal which is enabled for a set period, in response to a write command and an internal operation control signal, and generating a column select signal, an output control signal and an input control signal in response to the set period signal; and an internal operation circuit suitable for performing an internal operation of converting parity data generated from input data and storing the converted parity data in a memory cell array, in response to the column select signal, the output control signal and the input control signal.

In an embodiment, a semiconductor device may include: an internal operation control circuit suitable for generating a set period signal which is enabled in a first internal period and a second internal period, in response to a write command and an internal operation control signal, generating an output control signal and an input control signal in response to the set period signal, and generating a column select signal in response to the output control signal and the input control signal; and an internal operation circuit suitable for performing an internal operation of converting parity data generated from input data and storing the converted parity data in a memory cell array, in response to the column select signal, the output control signal and the input control signal.

According to the embodiments, advantages may be provided in that, when performing a write operation by masking some bits of external data, it is possible to perform an operation of reflecting an error of masked bits and storing converted parity data internally.

Also, according to the embodiments, advantages may be provided in that, by generating a column select signal which retains an enabled state during a set period in which operations of generating converted parity data and storing the converted parity data internally are performed, an operation speed may be improved when performing an internal operation.

Moreover, according to the embodiments, advantages may be provided in that, by generating a column select signal which retains an enabled state during an internal operation period in which operations of generating converted parity data and storing the converted parity data internally are performed, a timing for performing an internal operation may be easily controlled.

DETAILED DESCRIPTION

Hereinafter, a semiconductor device will be described below with reference to the accompanying drawings through various examples of embodiments.

Figure 1:
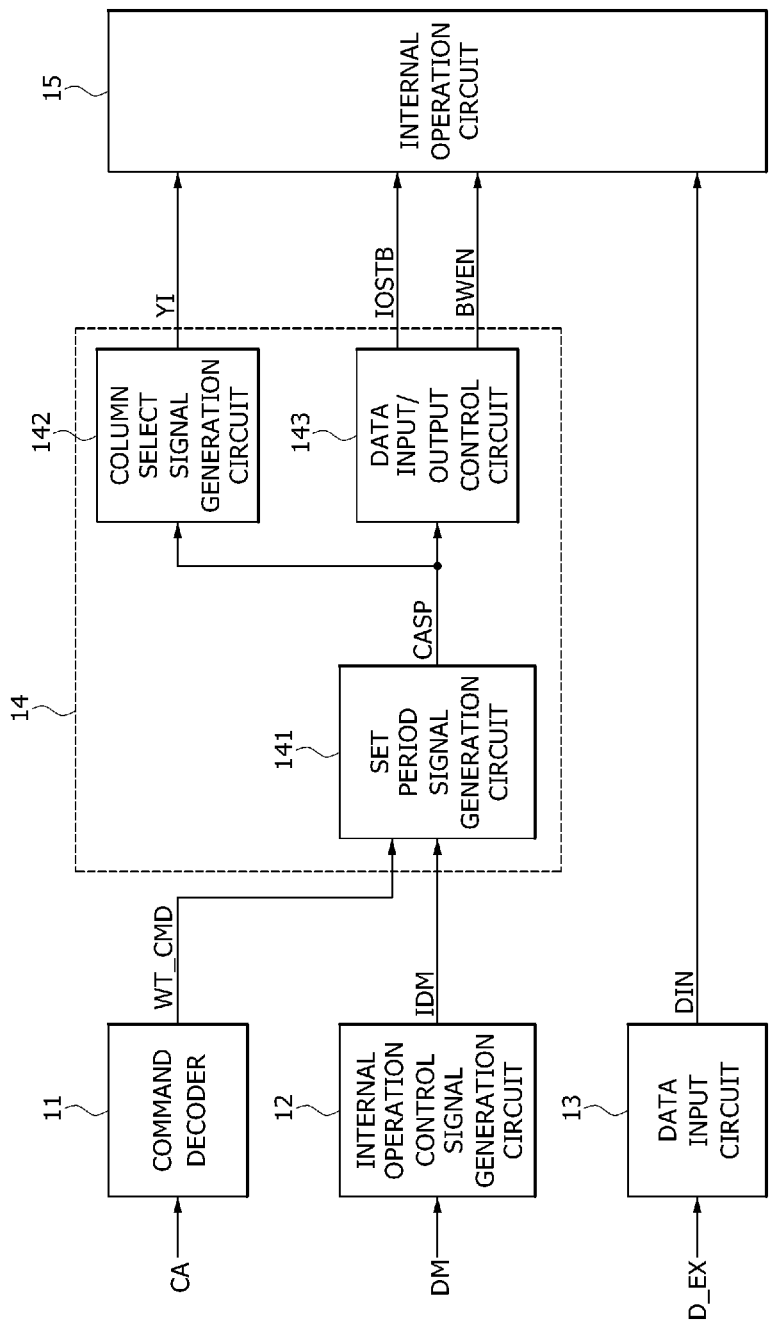
FIG. 1 is a block diagram illustrating a representation of an example configuration of a semiconductor device in accordance with an embodiment.

As shown in FIG. 1, a semiconductor device in accordance with an embodiment may include a command decoder 11, an internal operation control signal generation circuit 12, a data input circuit 13, an internal operation control circuit 14, and an internal operation circuit 15.

The command decoder 11 may decode an external command CA and generate a write command WT_CMD. The external command CA may be applied from at least one external device among a memory controller, a host and test equipment. The external command CA may include a plurality of bits. The command decoder 11 may decode the external command CA and generate the write command WT_CMD. The write command WT_CMD may be enabled for a write operation. A logic level at which the write command WT_CMD is enabled may be set in a variety of ways according to embodiments.

The internal operation control signal generation circuit 12 may generate an internal operation control signal IDM from an external operation control signal DM. The internal operation control signal generation circuit 12 may generate the internal operation control signal IDM by buffering or decoding the external operation control signal DM. The internal operation control signal IDM may be enabled for a masking write operation. Each of the external operation control signal DM and the internal operation control signal IDM may include a plurality of bits according to an embodiment. A logic level at which the internal operation control signal IDM is enabled may be set in a variety of ways according to embodiments.

The data input circuit 13 may generate input data DIN in response to external data D_EX. The data input circuit 13 may be realized by a buffer circuit which buffers the external data D_EX and outputs the input data DIN.

The internal operation control circuit 14 may include a set period signal generation circuit 141, a column select signal generation circuit 142, and a data input/output control circuit 143.

The set period signal generation circuit 141 may generate a set period signal CASP in response to the write command WT_CMD and the internal operation control signal IDM. The set period signal generation circuit 141 may generate the set period signal CASP which is enabled when both the write command WT_CMD and the internal operation control signal IDM are enabled. The set period signal CASP may be enabled for a predetermined set period. The set period may be a period in which an internal operation of converting the parity generated from the input data DIN, based on read-out data, and storing converted parity is performed. The parity or converted parity may be parity data, a parity bit, parity bits, a parity signal, etc., where the parity data may include one or more parity bits. A logic level at which the internal operation control signal IDM and the set period signal CASP are enabled may be set in a variety of ways according to embodiments.

The column select signal generation circuit 142 may generate a column select signal YI in response to the set period signal CASP. The column select signal generation circuit 142 may generate the column select signal YI by buffering the set period signal CASP. The column select signal YI may be enabled for the set period in which the set period signal CASP is enabled. According to an embodiment, the column select signal YI may be realized by a plurality of bits. A logic level at which the column select signal YI is enabled may be set in a variety of ways according to embodiments.

The data input/output control circuit 143 may generate an output control signal IOSTB and an input control signal BWEN in response to the set period signal CASP. The data input/output control circuit 143 may generate the output control signal IOSTB and the input control signal BWEN which are sequentially enabled within the set period in which the set period signal CASP is enabled. The output control signal IOSTB may be enabled for a first internal period included in the set period, and the input control signal BWEN may be enabled for a second internal period in the set period. The first internal period may be set so that an operation of reading the data stored in a memory cell array (not shown) to convert parity is performed. The second internal period may be set so that an operation of writing converted parity in the memory cell array is performed. A logic level at which the output control signal IOSTB and the input control signal BWEN are enabled may be set in a variety of ways according to embodiments. The first internal period and the second internal period may be set variously within the set period according to embodiments. The detailed configuration and operation of the data input/output control circuit 143 will be described later with reference to FIG. 2.

The internal operation circuit 15 may perform an internal operation of converting the parity generated from the input data DIN, based on read-out data, and storing converted parity, in response to the column select signal YI, the output control signal IOSTB, and the input control signal BWEN. The internal operation circuit 15 may perform an operation of reading the data stored in the memory cell array to convert parity, if both the column select signal YI and the output control signal IOSTB are enabled. The internal operation circuit 15 may perform an operation of writing converted parity in the memory cell array, if both the column select signal YI and the input control signal BWEN are enabled. The detailed configuration and operation of the internal operation circuit 15 will be described later with reference to FIGS. 3 and 4.

Figure 2:
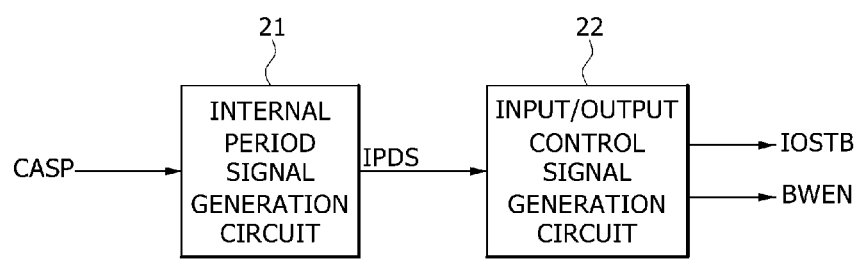
FIG. 2 is a block diagram illustrating a representation of an example data input/output control circuit included in the semiconductor device shown in FIG. 1.

As shown in FIG. 2, the data input/output control circuit 143 may include an internal period signal generation circuit 21 and an input/output control signal generation circuit 22.

The internal period signal generation circuit 21 may generate an internal period signal IPDS in response to the set period signal CASP. The internal period signal IPDS may be enabled in the first internal period and the second internal period, where the first internal period and the second internal period are included in the set period in which the set period signal CASP is enabled. The first internal period may be set so that the operation of reading the data stored in the memory cell array to convert parity is performed. The second internal period may be set to the operation of writing converted parity in the memory cell array is performed. The first internal period and the second internal period may be sequentially set, and period widths thereof may be set variously according to embodiments.

The input/output control signal generation circuit 22 may generate the output control signal IOSTB and the input control signal BWEN in response to the internal period signal IPDS. The input/output control signal generation circuit 22 may output the output control signal IOSTB by buffering the internal period signal IPDS which is enabled for the first internal period. The input/output control signal generation circuit 22 may output the input control signal BWEN by buffering the internal period signal IPDS which is enabled for the second internal period. The output control signal IOSTB may be enabled for the first internal period for performing the operation of reading the data stored in the memory cell array for the purpose of converting parity. The input control signal BWEN may be enabled for the second internal period for performing the operation of writing converted parity in the memory cell array.

Figure 3:
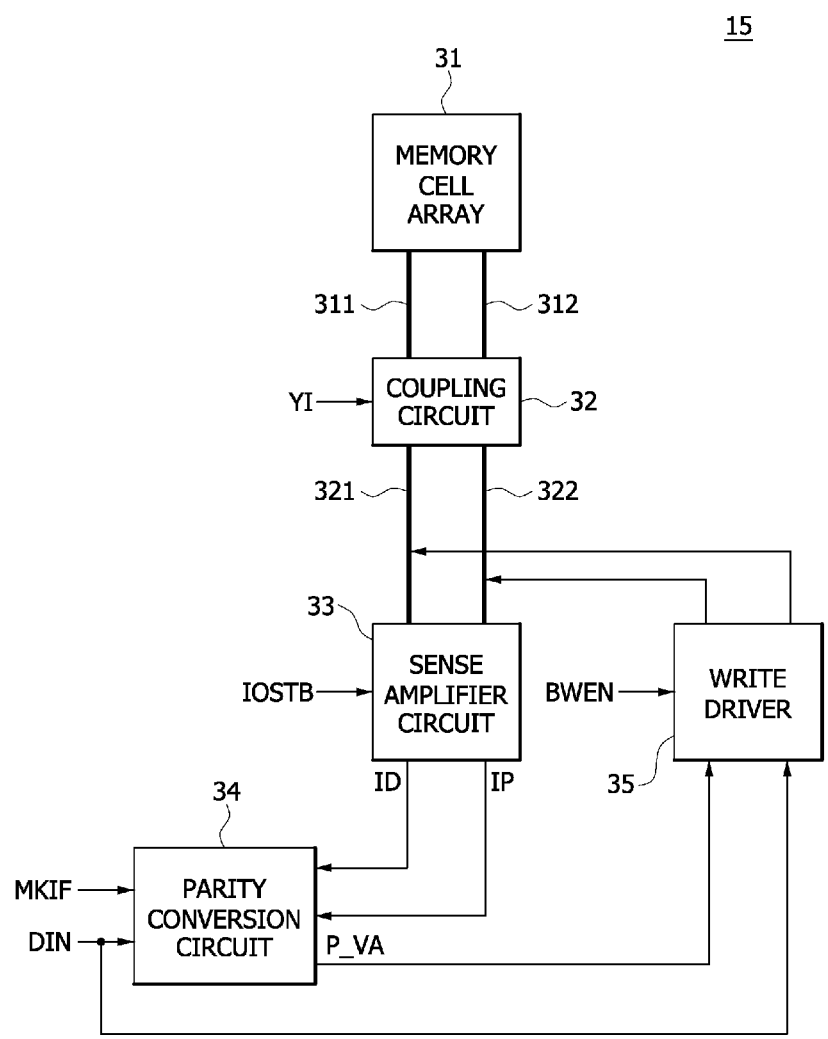
FIG. 3 is a block diagram illustrating a representation of an example internal operation circuit included in the semiconductor device shown in FIG. 1.

As shown in FIG. 3, the internal operation circuit 15 may include a memory cell array 31, a coupling circuit 32, a sense amplifier circuit 33, a parity conversion circuit 34, and a write driver 35. The memory cell array 31 and the coupling circuit 32 may be coupled by a first input/output line 311 and a second input/output line 312. The sense amplifier circuit 33 and the coupling circuit 32 may be coupled by a third input/output line 321 and a fourth input/output line 322.

The sense amplifier circuit 33 may generate internal data ID and internal parity IP from the data and parity stored in the memory cell array 31, in response to the output control signal IOSTB. The internal parity IP may be parity data, a parity bit, parity bits, a parity signal, etc., where the parity data may include one or more parity bits. The sense amplifier circuit 33 may receive the data stored in the memory cell array 31, through the first input/output line 311, the coupling circuit 32 and the third input/output line 321. The sense amplifier circuit 33 may sense and amplify the data, and output the internal data ID, for the first internal period in which the output control signal IOSTB is enabled. The sense amplifier circuit 33 may receive the parity stored in the memory cell array 31, through the second input/output line 312, the coupling circuit 32 and the fourth input/output line 322. The sense amplifier circuit 33 may sense and amplify the parity, and output the internal parity IP, for the first internal period in which the output control signal IOSTB is enabled.

The parity conversion circuit 34 may generate converted parity P_VA from masking information MKIF, the input data DIN, the internal data ID, and the internal parity IP. The input data DIN may be set to include the same bits as the internal data ID in which an error is not included. The parity conversion circuit 34 may convert the parity generated by the input data DIN when errors occur in bits to be masked among the bits included in the internal data ID, in response to the internal parity IP and the masking information MKIF, and the parity conversion circuit 34 may output the converted parity P_VA. Again, the converted parity P_VA may be parity data, a parity bit, parity bits, a parity signal, etc., where the parity data may include one or more parity bits. The masking information MKIF may include information on bits to be stored, where the bits to be stored are masked among the bits included in the input data DIN. According to an embodiment, the masking information MKIF may be realized as a signal which includes a plurality of bits. According to an embodiment, the masking information MKIF may be a signal which is generated internally or is applied from outside the internal operation circuit 15. According to an embodiment, the masking information MKIF may be transmitted through the same path as the external operation control signal DM. A detailed configuration and operation of the parity conversion circuit 34 will be described below with reference to FIG. 4.

The write driver 35 may store the input data DIN and the converted parity P_VA in the memory cell array 31 in response to the input control signal BWEN. The write driver 35 may write the input data DIN through the third input/output line 321, the coupling circuit 32 and the first input/output line 311 in the memory cell array 31 for the second internal period in which the input control signal BWEN is enabled. The write driver 35 may write the converted parity P_VA through the fourth input/output line 322, the coupling circuit 32 and the second input/output line 312 in the memory cell array 31 for the second internal period in which the input control signal BWEN is enabled.

Figure 4:
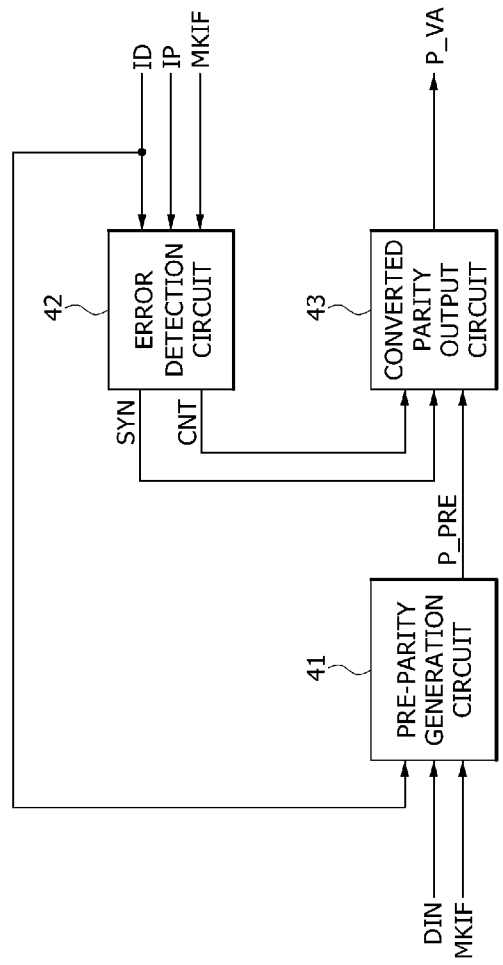
FIG. 4 is a block diagram illustrating a representation of an example parity conversion circuit included in the internal operation circuit shown in FIG. 3.

As shown in FIG. 4, the parity conversion circuit 34 may include a pre-parity generation circuit 41, an error detection circuit 42, and a converted parity output circuit 43.

The pre-parity generation circuit 41 may generate pre-parity P_PRE in response to the internal data ID, the input data DIN, and the masking information MKIF. The pre-parity P_PRE may be parity data, a parity bit, parity bits, a parity signal, etc., where the parity data may include one or more parity bits. The pre-parity generation circuit 41 may replace at least one bit to be masked among the bits included in the input data DIN, according to the masking information MKIF, with a corresponding bit of the internal data ID. The pre-parity generation circuit 41 may generate the pre-parity P_PRE from the input data DIN in which a bit to be masked is replaced with a corresponding bit of the internal data ID. The pre-parity P_PRE may be generated by employing an error correction code (ECC) scheme using a Hamming code.

The error detection circuit 42 may generate a syndrome signal SYN and a control signal CNT in response to the internal data ID, the internal parity IP, and the masking information MKIF. The error detection circuit 42 may generate the syndrome signal SYN from the internal data ID and the internal parity IP by employing the error correction code scheme using a Hamming code. The syndrome signal SYN may include information on a bit including an error, among the bits included in the internal data ID. According to an embodiment, the syndrome signal SYN may be realized as a signal which includes a plurality of bits. The error detection circuit 42 may generate the control signal CNT in response to the syndrome signal SYN and the masking information MKIF. Each bit may have a position, such as a first bit among eight, for example. The error detection circuit 42 may generate the control signal CNT which is enabled when the position of a bit having an error among the bits included in the internal data ID corresponds to the position of a bit to be masked among the bits included in the input data DIN by the masking information MKIF. A logic level at which the control signal CNT is enabled may be set in a variety of ways according to embodiments.

The converted parity output circuit 43 may generate the converted parity P_VA from the syndrome signal SYN and the pre-parity P_PRE in response to the control signal CNT. The converted parity output circuit 43 may generate the converted parity P_VA by including the information of the syndrome signal SYN in the pre-parity P_PRE, if the control signal CNT is enabled. The converted parity output circuit 43 may generate the converted parity P_VA by performing an exclusive OR function on the pre-parity P_PRE and the syndrome signal SYN if the control signal CNT is enabled. Error information on bits to be masked among the bits included in the input data DIN may be included in the converted parity P_VA. The converted parity output circuit 43 may generate the converted parity P_VA by buffering the pre-parity P_PRE if the control signal CNT is disabled.

Figure 5:
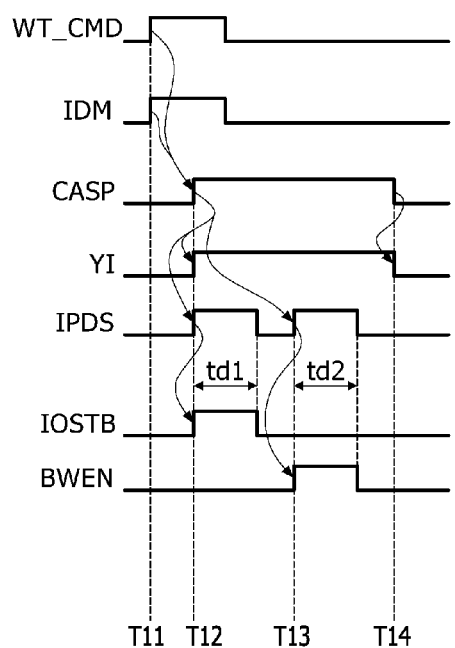
FIG. 5 is a representation of an example timing diagram to assist in an explanation of the operation of the semiconductor device shown in FIGS. 1 to 4.

The operation of the semiconductor device configured as mentioned above will be described below with reference to FIG. 5.

The set period signal CASP which is enabled for a set period between a time T12 and a time T14 is generated in synchronization with the write command WT_CMD and the internal operation control signal IDM both of which are enabled at a time T11.

In order to output the data stored in the memory cell array 31 to generate the converted parity P_VA, the column select signal YI which is enabled to a logic high level for the set period between the time T12 and the time T14 is generated in synchronization with the set period signal CASP.

At the time T12, the internal period signal IPDS is generated from the set period signal CASP. The internal period signal IPDS may be enabled in the first internal period and the second internal period included in the set period in which the set period signal CASP is enabled. The first internal period may be set as a period between the time T12 and a time after a first delay period td1 passes from the time T12, in which the operation of reading the data stored in the memory cell array 31 to generate the converted parity P_VA is performed. The second internal period may be set as a period between the time T13 and a time after a second delay period td2 passes from the time T13, in which the operation of writing the converted parity P_VA in the memory cell array 31 is performed.

The output control signal IOSTB is generated while the internal period signal IPDS is buffered, and the input control signal BWEN is generated while the internal period signal IPDS is buffered.

As is apparent from the above descriptions, in the semiconductor device in accordance with an embodiment, the internal operation of generating the converted parity P_VA by the write command WT_CMD and the internal operation control signal IDM and storing the converted parity P_VA in the memory cell array 31 may be performed. In the semiconductor device in accordance with an embodiment, by generating the column select signal YI which retains the enabled state for the set period in which the internal operation is performed, the column select signal YI does not need to toggle for the operations in the first internal period and the second internal period, whereby an operation speed may be improved. Further, in the semiconductor device in accordance with an embodiment, it is possible to freely control the setting timings of the first internal period in which the output control signal IOSTB is enabled and the second internal period in which the input control signal BWEN is enabled, within the set period in which the set period signal CASP is enabled.

Figure 6:
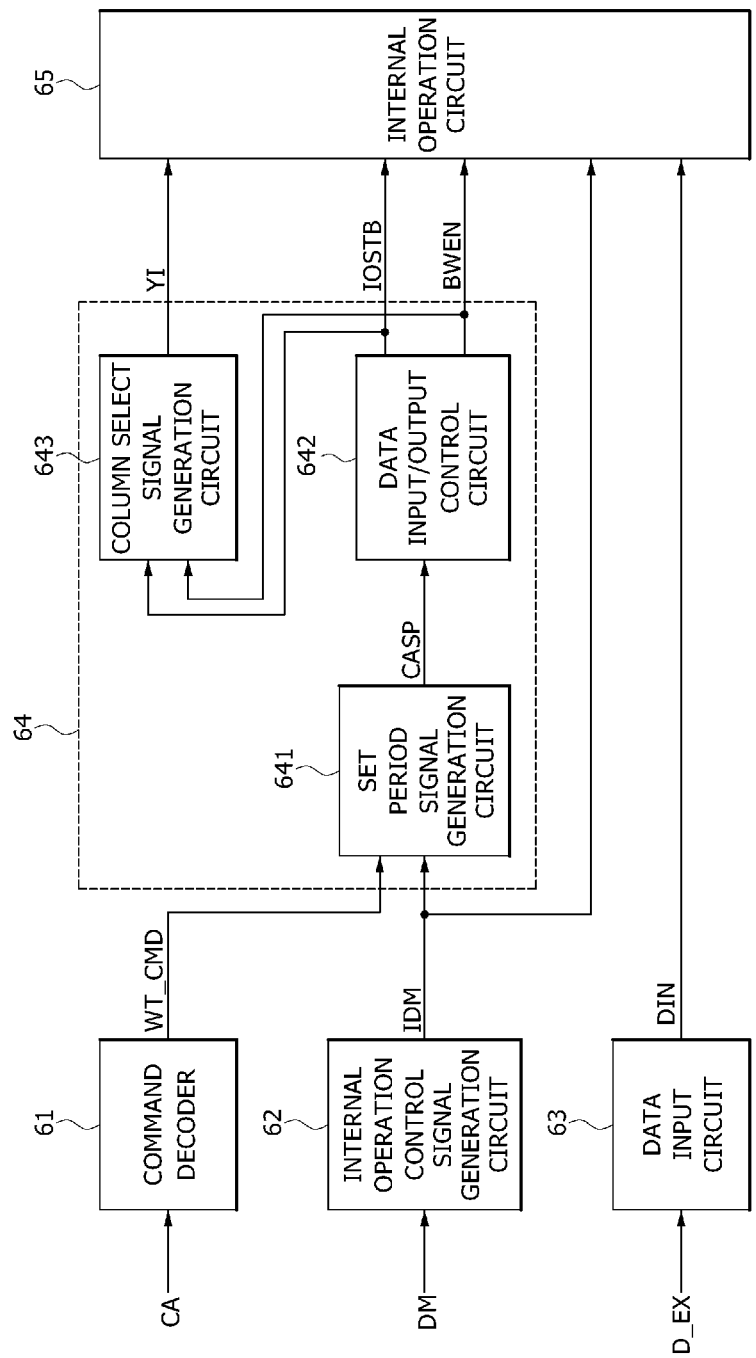
FIG. 6 is a block diagram illustrating a representation of an example configuration of a semiconductor device in accordance with another embodiment.

As shown in FIG. 6, a semiconductor device in accordance with another embodiment may include a command decoder 61, an internal operation control signal generation circuit 62, a data input circuit 63, an internal operation control circuit 64, and an internal operation circuit 65. In some embodiments, the disclosure related to components discussed in relation to FIGS. 1 through 4, but not discussed in FIG. 6, may apply to FIG. 6.

The command decoder 61 may decode an external command CA and generate a write command WT_CMD. The external command CA may be applied from at least one external device among a memory controller, a host, and test equipment. The external command CA may include a plurality of bits. The command decoder 61 may decode the external command CA and generate the write command WT_CMD. The write command WT_CMD may be enabled for a write operation. A logic level at which the write command WT_CMD is enabled may be set in a variety of ways according to embodiments.

The internal operation control signal generation circuit 62 may generate an internal operation control signal IDM from an external operation control signal DM. The internal operation control signal generation circuit 62 may generate the internal operation control signal IDM by buffering or decoding the external operation control signal DM. The internal operation control signal IDM may be enabled for a masking write operation. Each of the external operation control signal DM and the internal operation control signal IDM may include a plurality of bits according to an embodiment. A logic level at which the internal operation control signal IDM is enabled may be set in a variety of ways according to embodiments.

The data input circuit 63 may generate input data DIN in response to external data D_EX. The data input circuit 63 may be realized by a buffer circuit which buffers the external data D_EX and outputs the input data DIN.

The internal operation control circuit 64 may include a set period signal generation circuit 641, a data input/output control circuit 642, and a column select signal generation circuit 643.

The set period signal generation circuit 641 may generate a set period signal CASP in response to the write command WT_CMD and the internal operation control signal IDM. The set period signal generation circuit 641 may generate the set period signal CASP which is enabled in a first internal period and a second internal period, in synchronization with a time at which both the write command WT_CMD and the internal operation control signal IDM are enabled. The first internal period may be set to perform an operation of reading the data stored in a memory cell array (not shown) to convert parity. The second internal period may be set to perform an operation of writing converted parity in the memory cell array. A logic level at which the internal operation control signal IDM and the set period signal CASP are enabled may be set in a variety of ways according to embodiments.

The data input/output control circuit 642 may generate an output control signal IOSTB and an input control signal BWEN in response to the set period signal CASP. The data input/output control circuit 642 may generate the output control signal IOSTB by buffering the set period signal CASP in the first internal period. The data input/output control circuit 642 may generate the input control signal BWEN by buffering the set period signal CASP in the second internal period. The output control signal IOSTB may be enabled for the first internal period for performing the operation of reading data stored in the memory cell array to convert parity. The input control signal BWEN may be enabled for the second internal period for performing the operation of writing converted parity in the memory cell array. A logic level at which the output control signal IOSTB and the input control signal BWEN are enabled may be set in a variety of ways according to embodiments. The first internal period and the second internal period may be set variously within the set period according to embodiments.

The column select signal generation circuit 643 may generate a column select signal YI in response to the output control signal IOSTB and the input control signal BWEN. The column select signal generation circuit 643 may generate the column select signal YI in synchronization with the output control signal IOSTB and the input control signal BWEN. The column select signal YI may be enabled in synchronization with the output control signal IOSTB, and may be disabled in synchronization with the input control signal BWEN. The column select signal YI may be enabled in synchronization with a time at which the output control signal IOSTB is enabled, and may be disabled at a time when a third delay period passes from a time at which the input control signal BWEN is disabled. According to an embodiment, the column select signal YI may be realized by a plurality of bits. A logic level at which the column select signal YI is enabled may be set in a variety of ways according to embodiments.

The internal operation circuit 65 may perform an internal operation of converting the parity generated from the input data DIN, based on read-out data, and storing the converted parity, in response to the column select signal YI, the output control signal IOSTB, and the input control signal BWEN. The internal operation circuit 65 may perform an operation of reading the data stored in the memory cell array to convert parity, when both the column select signal YI and the output control signal IOSTB are enabled. The internal operation circuit 65 may perform an operation of writing converted parity in the memory cell array, when both the column select signal YI and the input control signal BWEN are enabled.

Figure 7:
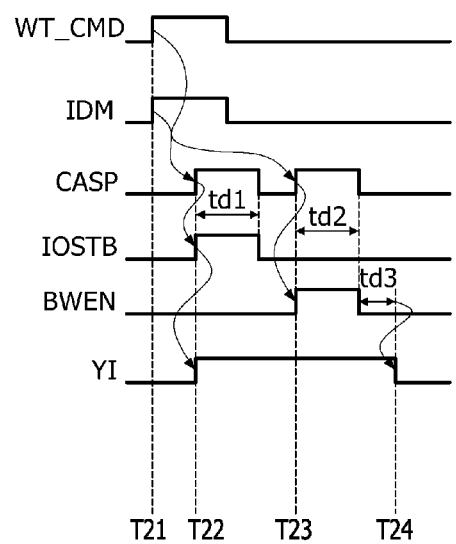
FIG. 7 is a representation of an example timing diagram to assist in an explanation of the operation of the semiconductor device shown in FIG. 6.

The operation of the semiconductor device configured as mentioned above will be described below with reference to FIG. 7.

The set period signal CASP which is enabled to a logic high level in the first internal period and the second internal period is generated in response to the write command WT_CMD and the internal operation control signal IDM both of which are enabled at a time T21. The first internal period may be set as a period between a time T22 and a time after a first delay period td1 passes, in which the operation of reading the data stored in the memory cell array 31 to generate the converted parity P_VA is performed. The second internal period may be set as a period between a time T23 and a time after a second delay period td2 passes, in which the operation of writing the converted parity P_VA in the memory cell array 31 is performed.

The output control signal IOSTB is generated when the set period signal CASP which is enabled for the first internal period is buffered, and the input control signal BWEN is generated when the set period signal CASP which is enabled for the second internal period is buffered.

The column select signal YI is generated in synchronization with the output control signal IOSTB and the input control signal BWEN. The column select signal YI is enabled in synchronization with the time T22 when the output control signal IOSTB is enabled, and is disabled at a time T24 when a third delay period td3 passes from a time at which the input control signal BWEN is disabled.

As is apparent from the above descriptions, the semiconductor device in accordance with an embodiment may perform an internal operation by the write command WT_CMD and the internal operation control signal IDM. In the semiconductor device in accordance with an embodiment, by generating the column select signal YI which retains the enabled state for the set period in which the internal operation is performed, the column select signal YI does not need to toggle for the operations in the first internal period and the second internal period, whereby an operation speed may be improved. Further, in the semiconductor device in accordance with an embodiment, it is possible to freely control the setting timings of the first internal period in which the output control signal IOSTB is enabled and the second internal period in which the input control signal BWEN is enabled.

Figure 8:
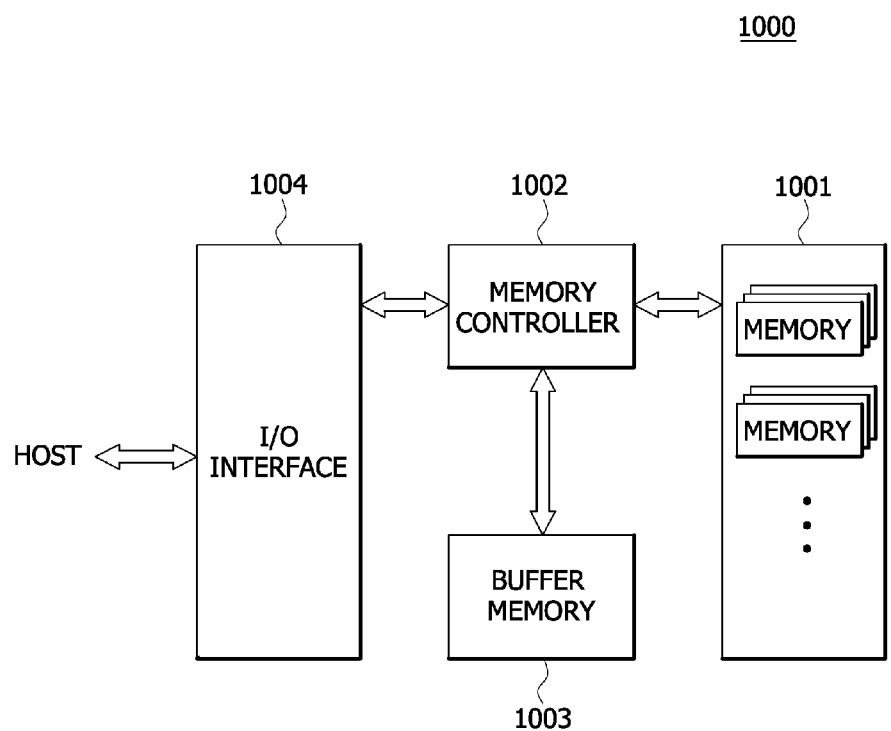
FIG. 8 is a block diagram illustrating a representation of an example configuration of an electronic system to which the semiconductor device shown in FIGS. 1 to 7 is applied.

The semiconductor device described above with reference to FIGS. 1 to 7 may be applied to an electronic system which includes a memory system, a graphic system, a computing system or a mobile system. For example, referring to FIG. 8, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include the semiconductor device shown in FIG. 1 or the semiconductor device shown in FIG. 6. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM), or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 8, it is to be noted that, in the memory controller 1002, a controller for controlling a nonvolatile memory and a controller for controlling the buffer memory 1003 as a volatile memory may be independently configured.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

Figure 9:
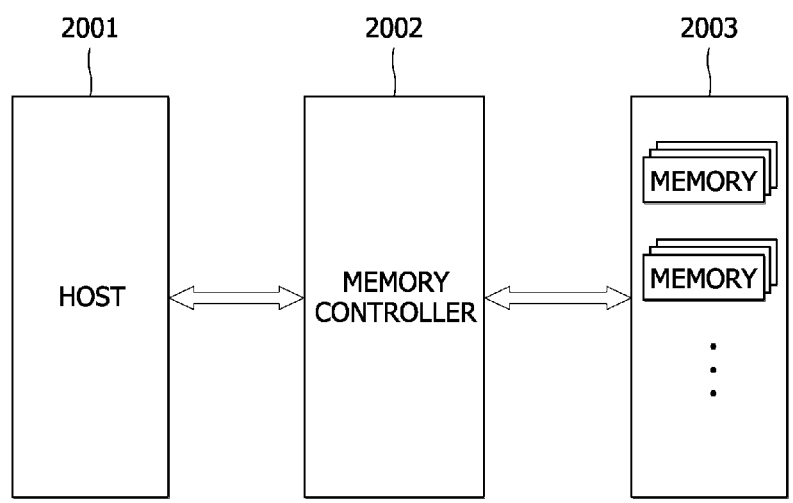
FIG. 9 is a diagram illustrating a representation of an example configuration of an electronic system to which the semiconductor device shown in FIGS. 1 to 7 is applied.

Referring to FIG. 9, an electronic system 2000 in accordance with another embodiment may include a host 2001, a memory controller 2002, and a data storage 2003.

The host 2001 may transmit a request and data to the memory controller 2002 to access the data storage 2003. The memory controller 2002 may provide data, a data strobe, a command, an address and a clock to the data storage 2003 in response to the request, and in response to this, the data storage 2003 may perform a write or read operation. The host 2001 may transmit data to the memory controller 2002 to store the data in the data storage 2003. Also, the host 2001 may receive, through the memory controller 2002, the data outputted from the data storage 2003. The host 2001 may include a circuit which corrects an error included in the data, by using an error correction code (ECC) scheme.

The memory controller 2002 may relay communication between the host 2001 and the data storage 2003. The memory controller 2002 may receive a request and data from the host 2001. In order to control operation of the data storage 2003, the memory controller 2002 may generate data, a data strobe, a command, an address and a clock, and provide them to the data storage 2003. The memory controller 2002 may provide the data outputted from the data storage 2003, to the host 2001.

The data storage 2003 may include a plurality of memories. The data storage 2003 may receive data, a data strobe, a command, an address, and a clock from the memory controller 2002, and perform a write or read operation. Each of the plurality of memories included in the data storage 2003 may include a circuit which corrects an error included in data, by using the error correction code (ECC) scheme.

The error correction circuit included in the host 2001 and the error correction circuits included in the plurality of memories in the data storage 2003 may be realized to operate all together or operate selectively, according to embodiments. The host 2001 and the memory controller 2002 may be realized by the same chip according to an embodiment. The memory controller 2002 and the data storage 2003 may be realized by the same chip according to an embodiment.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
    an internal operation control circuit suitable for generating a set period signal which is enabled for a set period, in response to a write command and an internal operation control signal, and generating a column select signal, an output control signal and an input control signal in response to the set period signal; and
    an internal operation circuit suitable for performing an internal operation of converting parity data generated from input data and storing the converted parity data in a memory cell array, in response to the column select signal, the output control signal and the input control signal,
    wherein the internal operation circuit comprises a pre-parity generation circuit suitable for replacing at least one bit to be masked among bits included in the input data according to masking information, with a bit corresponding to internal data, and generating the pre-parity data from the input data in which the bit is replaced.

2. The semiconductor device according to claim 1, wherein the set period includes a first internal period and a second internal period.

3. The semiconductor device according to claim 1, wherein the output control signal is enabled in the first internal period, and the input control signal is enabled in the second internal period.

4. The semiconductor device according to claim 1, wherein the internal operation control circuit comprises:
    a set period signal generation circuit suitable for generating the set period signal which is enabled for the set period, in synchronization with a time at which the write command and the internal operation control signal are enabled.

5. The semiconductor device according to claim 1, wherein the internal operation control circuit comprises:
    a column select signal generation circuit suitable for generating the column select signal which is enabled for the set period, in response to the set period signal.

6. The semiconductor device according to claim 1, wherein the internal operation control circuit comprises:
    a data input/output control circuit suitable for generating the output control signal which is enabled in the first internal period included in the set period and generating the input control signal which is enabled in the second internal period included in the set period, in response to the set period signal.

7. The semiconductor device according to claim 6, wherein the data input/output control circuit comprises:
    an internal period signal generation circuit suitable for generating an internal period signal which is enabled in the first internal period and the second internal period, in response to the set period signal; and
    an input/output control signal generation circuit suitable for generating the output control signal and the input control signal in response to the internal period signal.

8. The semiconductor device according to claim 1, wherein the internal operation circuit comprises:
    a sense amplifier circuit suitable for sensing and amplifying data and parity data outputted from the memory cell array and generating the internal data and internal parity data in response to the output control signal;
    a parity conversion circuit suitable for generating the converted parity data from the masking information, the input data, the internal data and the internal parity data; and
    a write driver suitable for storing the converted parity data in the memory cell array in response to the input control signal.

9. The semiconductor device according to claim 1, wherein the internal operation circuit comprises:
    a parity conversion circuit suitable for generating the converted parity data by converting the pre-parity data which is generated from the input data if an error is included in a bit to be masked among bits included in the internal data generated from the memory cell array in response to the output control signal.

10. The semiconductor device according to claim 1, wherein the parity conversion circuit generates a syndrome signal from the internal data and the internal parity data, and generates a control signal according to the syndrome signal and the masking information.

11. The semiconductor device according to claim 10, wherein the control signal is enabled if a position of a bit having an error among bits included in the internal data corresponds to a position of a bit to be masked.

12. The semiconductor device according to claim 10, wherein the parity conversion circuit comprises:
    a converted parity output circuit suitable for generating the converted parity data from the pre-parity data and the syndrome signal in response to the control signal.

13. The semiconductor device according to claim 12, wherein the converted parity output circuit generates the converted parity data by performing an exclusive OR function on the syndrome signal and the pre-parity data if the control signal is enabled.

14. A semiconductor device comprising:
    an internal operation control circuit suitable for generating a set period signal which is enabled in a first internal period and a second internal period, in response to a write command and an internal operation control signal, generating an output control signal and an input control signal in response to the set period signal, and generating a column select signal in response to the output control signal and the input control signal; and
    an internal operation circuit suitable for performing an internal operation of converting parity data generated from input data and storing the converted parity data in a memory cell array, in response to the column select signal, the output control signal and the input control signal, wherein the internal operation control circuit comprises an internal period signal generation circuit suitable for generating an internal period signal which is enabled in the first internal period and the second internal period, in response to the set period signal, and an input/output control signal generation circuit suitable for generating the output control signal and the input control signal in response to the internal period signal.

15. The semiconductor device according to claim 14, wherein the output control signal is enabled in the first internal period, and the input control signal is enabled in the second internal period.

16. The semiconductor device according to claim 14, wherein the internal operation control circuit generates the set period signal which is enabled in the first internal period and the second internal period set in synchronization with a time at which the write command and the internal operation control signal are enabled.

17. The semiconductor device according to claim 14, wherein the internal operation control circuit generates the output control signal by buffering the set period signal in the first internal period, and generates the input control signal by buffering the set period signal in the second internal period.

18. The semiconductor device according to claim 14, wherein the column select signal is enabled in synchronization with the output control signal, and is disabled in synchronization with the input control signal.

19. The semiconductor device according to claim 14, wherein the internal operation circuit comprises:
   a parity conversion circuit suitable for generating the converted parity data by converting pre-parity data which is generated from the input data if an error is included in a bit to be masked among bits included in internal data generated from the memory cell array in response to the output control signal.

* * * * *